(12) United States Patent
Jones et al.

(10) Patent No.: US 7,133,397 B2
(45) Date of Patent: Nov. 7, 2006

(54) TIME DIVISION DUPLEX SYSTEM UTILIZING GLOBAL POSITIONING SYSTEM TIMING SIGNALS FOR ACCESS POINT SYNCHRONIZATION

(75) Inventors: Delon K. Jones, West Bountiful, UT (US); James M. Simkins, Park City, UT (US)

(73) Assignee: L-3 Communications Corporation, New York, NY (US)

( * ) Notice: Subject to any disclaimer, the term of this patent is extended or adjusted under 35 U.S.C. 154(b) by 797 days.

(21) Appl. No.: 09/948,615

(22) Filed: Sep. 7, 2001

(65) Prior Publication Data

US 2003/0048758 A1    Mar. 13, 2003

(51) Int. Cl.
*H04J 3/06*    (2006.01)

(52) U.S. Cl. ............... 370/350; 370/280; 370/503; 370/516; 370/324

(58) Field of Classification Search ............ 370/276, 370/277, 280, 350, 347, 503, 516, 324, 321
See application file for complete search history.

(56) References Cited

U.S. PATENT DOCUMENTS

| | | | | |
|---|---|---|---|---|
| 5,727,034 A * | 3/1998 | Ojaniemi | ............ | 375/356 |
| 5,757,786 A * | 5/1998 | Joo | ............ | 370/324 |
| 5,940,458 A * | 8/1999 | Suk | ............ | 375/376 |
| 6,236,623 B1 * | 5/2001 | Read et al. | ............ | 368/46 |
| 6,304,582 B1 * | 10/2001 | Zhang et al. | ............ | 370/503 |
| 6,731,711 B1 * | 5/2004 | Jun | ............ | 375/368 |
| 2002/0114304 A1 * | 8/2002 | Crosbie et al. | ............ | 370/338 |
| 2002/0141452 A1 * | 10/2002 | Mauritz et al. | ............ | 370/503 |

* cited by examiner

*Primary Examiner*—Ricky Q. Ngo
*Assistant Examiner*—Nguyen Ngo
(74) *Attorney, Agent, or Firm*—Perman & Green, LLP

(57) ABSTRACT

A method and apparatus for Time Division Duplex (TDD) synchronization of Access Points (APEs) uses the 1 pulse-per-second timing pulses of the Global Positioning System (GPS) and synchronization state machines for its Time Division Multiple Access (TDMA) structure. As a result, the present invention obviates the need for expensive voltage-controlled oscillators used by the prior art, and achieves stable timing accuracy within approximately 7.5 minutes, as opposed to the 12 to 24-hour period needed by prior art methods.

13 Claims, 4 Drawing Sheets

TIME DIVISION DUPLEX SYSTEM UTILIZING GLOBAL POSITIONING SYSTEM TIMING SIGNALS FOR ACCESS POINT SYNCHRONIZATION

FIELD OF THE INVENTION

The present invention broadly relates to Time Division Duplex systems. More particularly, the present invention relates to improvements in the temporal alignment of the components in Time Division Duplex systems.

BACKGROUND OF RELATED ART

Time Division Duplex (TDD) systems allow one or more Access Points (APEs) to bidirectionally communicate with Customer Premises Equipment (CPE) such as mobile telephones. As many APEs (also known as hubs) and a multitude of CPEs may be operational in a system, it is important that strict timing protocols be observed to avoid communication conflicts. In multi-sectored systems, time slots allotted to each sector also include guard times to prevent the activity of one sector from encroaching upon the designated time slots of other sectors.

Typical prior art TDD systems incorporate highly stable voltage controlled oscillators (VCOs) in the hubs to provide accurate timing control. In addition to being expensive, such approaches also require transient periods of up to twenty-four hours before the local oscillator has achieved suitable stabilization.

There is a great need to provide in a TDD system, a Time Division Multiple Access architecture that incorporates timing generators that are both low cost, and that achieve stabilization shortly after they are activated.

SUMMARY OF THE INVENTION

In view of the above-identified problems and limitations of the prior art, the present invention provides in a Time Division Duplex (TDD) system, an apparatus for temporally aligning Access Points (APEs) in the system. The apparatus at least includes a Global Positioning System (GPS) receiver adapted to receive GPS timing signals, an APE local oscillator, and a timing generator having a dead time counter, the timing generator coupled to the local oscillator and adapted to generate a System Timing signal. The apparatus also at least includes a phase error detector adapted to compare the GPS timing signals with a symbol clock signal derived from the System Timing signal, and a synchronization state machine coupled to the phase error detector. The synchronization state machine generates synchronization information in response to the output of the phase error detector; and the synchronization information is adapted to adjust the frequency of the local oscillator via the dead time counter.

The present invention also provides in a TDD system, a method for temporally aligning APEs in the system. The method at least includes the steps of receiving GPS timing signals, via an APE local oscillator, generating an APE reference clock signal, and via a timing generator having a dead time counter, generating a System Timing signal. The method also at least includes the steps of detecting a phase error between the GPS timing signals and a symbol clock signal derived from the System Timing signal, and via a synchronization state machine coupled to the phase error detector, generating synchronization information in response to the output of the phase error detector. The synchronization information in response to the output of the phase error detector. The synchronization information is adapted to adjust the frequency of the local oscillator via the dead time counter.

The present invention is described in detail below, with reference to the drawings.

BRIEF DESCRIPTION OF THE DRAWINGS

Features and advantages of the present invention will become apparent to those skilled in the art from the following description with reference to the drawings, in which.

DETAILED DESCRIPTION OF THE PREFERRED EMBODIMENTS

Figure 1:
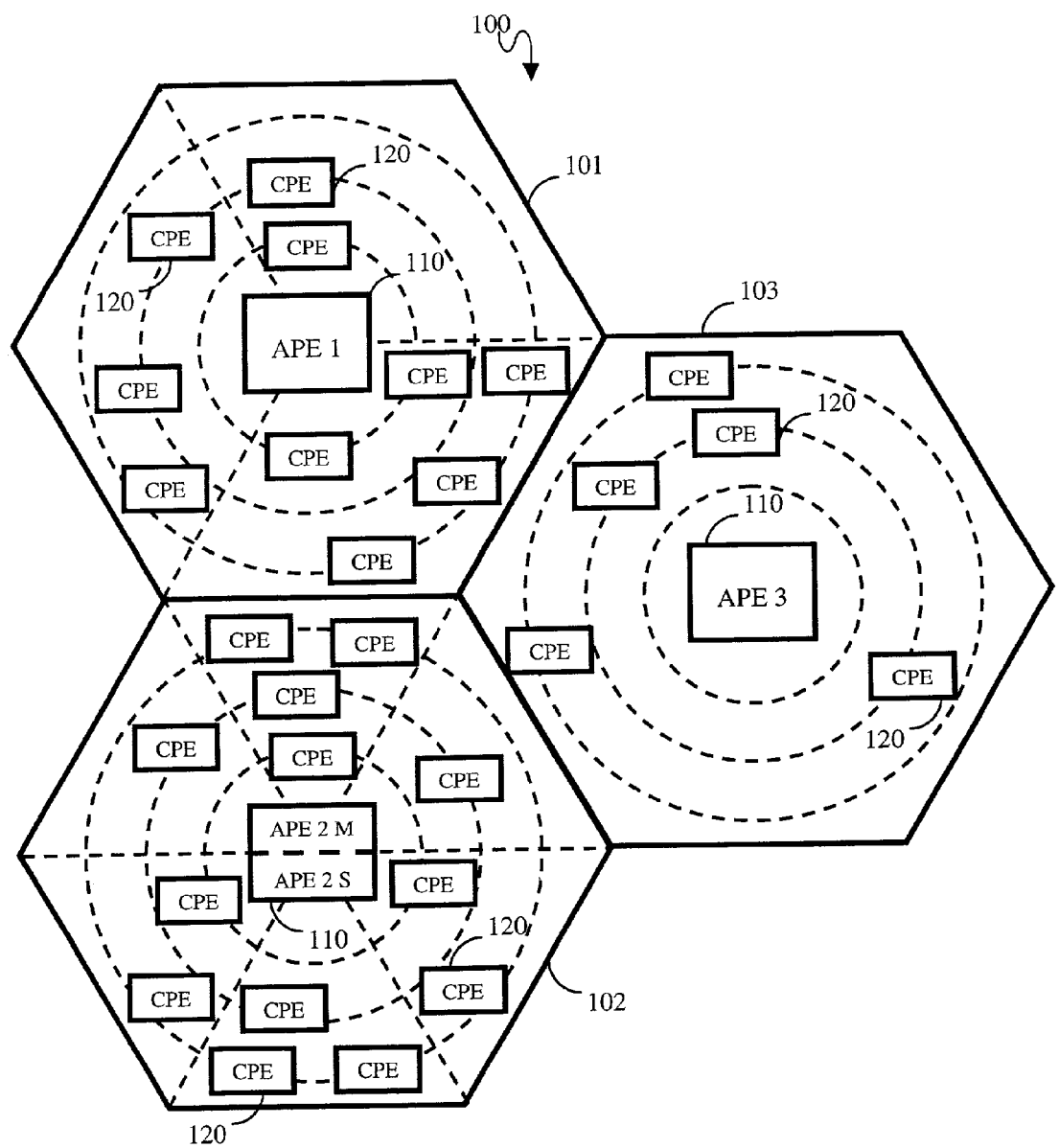
FIG. 1 is a general schematic block diagram of a time division duplex system with synchronization according to the present invention.

FIG. 1 is a general schematic block diagram of a Time Division Duplex system 100 with components that are temporally aligned according to the present invention. As is shown in the figure, several Access Points (APEs), which are also known as "hubs," engage in duplex communication with a number of Customer Premises Equipment (CPE) devices 120, such as mobile telephones. Each hub is responsible for communicating with all of the CPEs currently located in its designated cell.

In the example of FIG. 1, each of the cells (101, 102 and 103) has a different number of sectors for illustrative purposes. APE 1 in cell 101 has a three sector configuration, while APE 2 in cell 102 has a six sector configuration. However, APE 3 in cell 103 has an "omni" configuration (one sector representing 360 degrees). Those skilled in the art will appreciate that different numbers of sectors of different sizes can be included in the cells of the system 100 without departing from the essence of the present invention. The APE 2 is of the master/slave variety, having a master component APE 2 M and a slave component APE 2 S.

Proper operation of the TDD system 100 requires that the APEs have synchronized clocks so that the transmit and receive operations of one sector occur during a designated time slot, and do not overlap into the designated time slots of other sectors. Proper operation of the TDD system also requires that all of the CPEs 120 in communication with an APE 110 be synchronized with the APE 110.

The synchronization of the components of the present-inventive TDD system is explained below, with reference to FIGS. 2–4.

Figure 2:
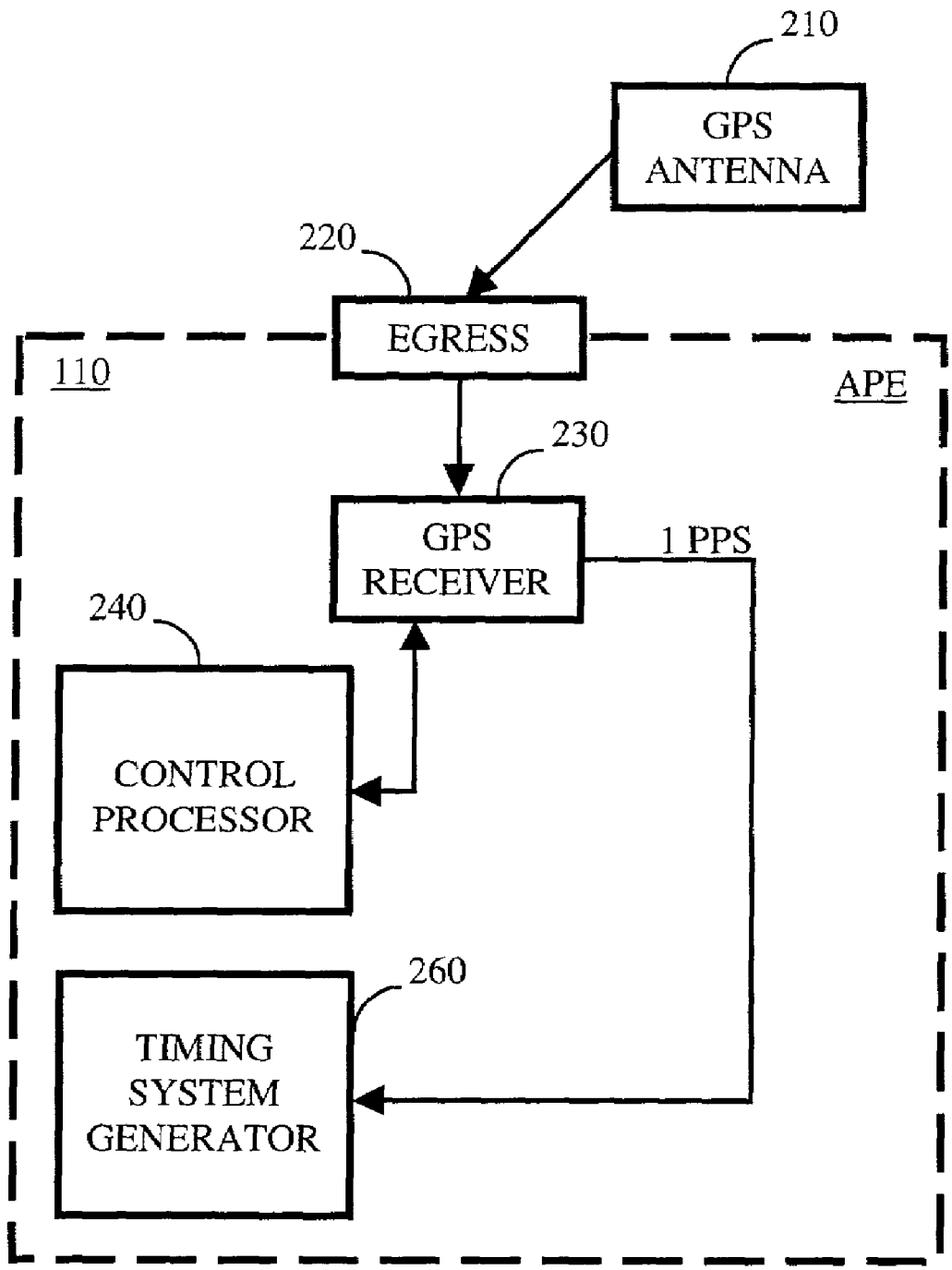
FIG. 2 is a schematic block diagram of an Access Point (Hub) constructed according to the present invention.

A general schematic block diagram of the APEs 110 of the present invention appears in FIG. 2. The APE 110 is connected to a Global Positioning System (GPS) antenna 210 via an egress panel 220. A GPS receiver 230 receives a GPS signal via the egress panel and the GPS antenna. Under the control of an APE Control Processor 240 which is interfaced to the GPS receiver, the GPS receiver 230 separates a 1 pulse-per-second ("1 PPS") timing signal ("GPS timing signal") from the GPS signal and forwards it to the APE System Timing Generator. In addition to other functions, a system timing generator 260 is responsible for synchronizing the operation of the APE 110 to other APEs 110 and CPEs 120 in the TDD system (FIG. 1, Item 100).

The present invention utilizes the stable and accurate timing signal of the GPS, which is accepted to be accurate to within 50 nanoseconds of Universal Time Coordinated (UTC). The 1 PPS GPS timing signal is used to synchronize low-cost reference clocks on the APEs 110 and in CPEs 120. Synchronizing state machines provide adjustments in the System Timing signals generated by timing generators, and to the Master Clock Reference based upon the phase difference between a hub symbol clock and the GPS timing signal. The reference oscillators used need not be voltage-controlled. GPS receivers are known to be stable in approximately 450 seconds after power-up. This is in stark contrast to the 12 to 24 hours needed by VCOs used in prior art TDD synchronization methods.

Figure 3:
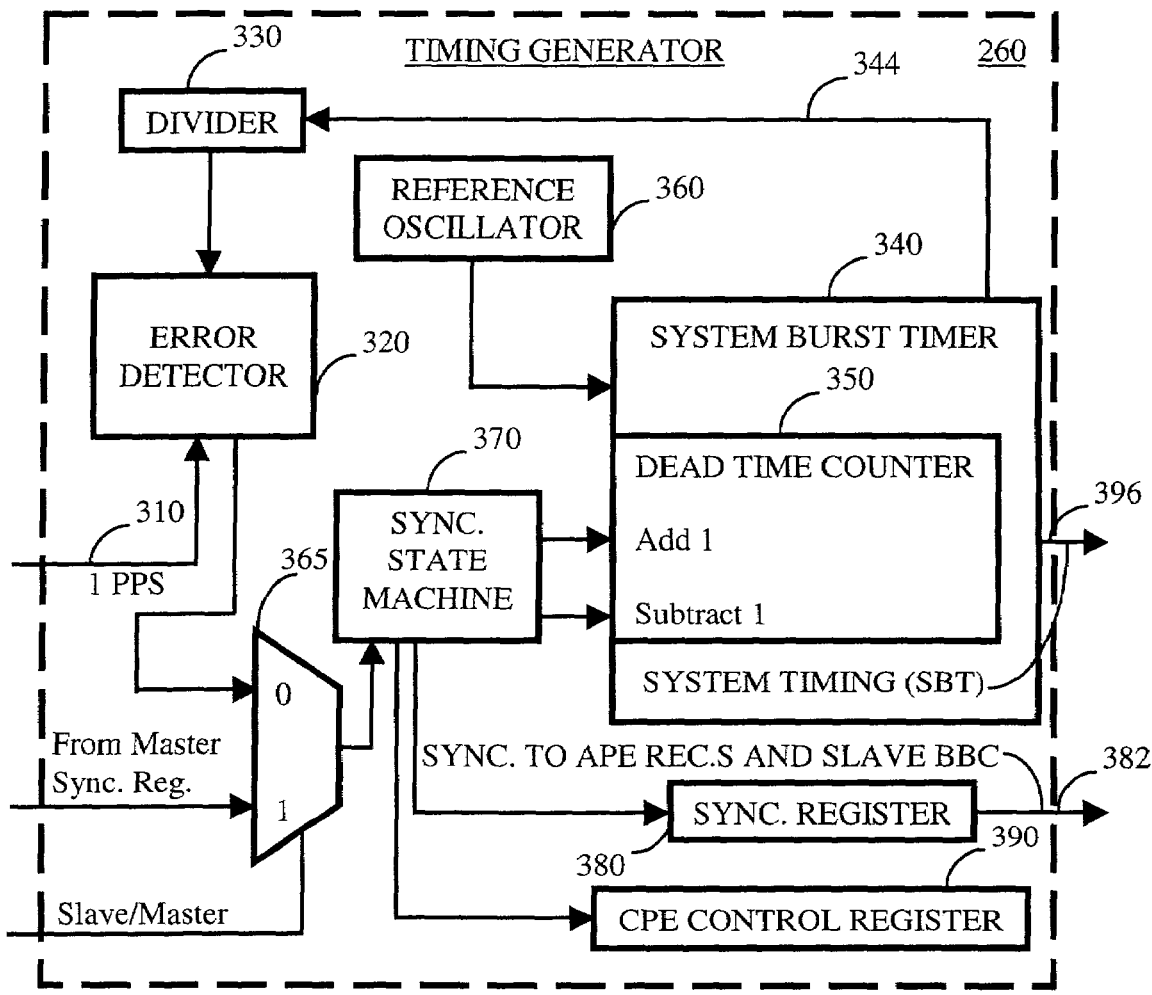
FIG. 3 is a schematic block diagram of a baseband combiner used in the Access Point of FIG. 2, which baseband combiner is constructed according to the present invention.
Figure 4:
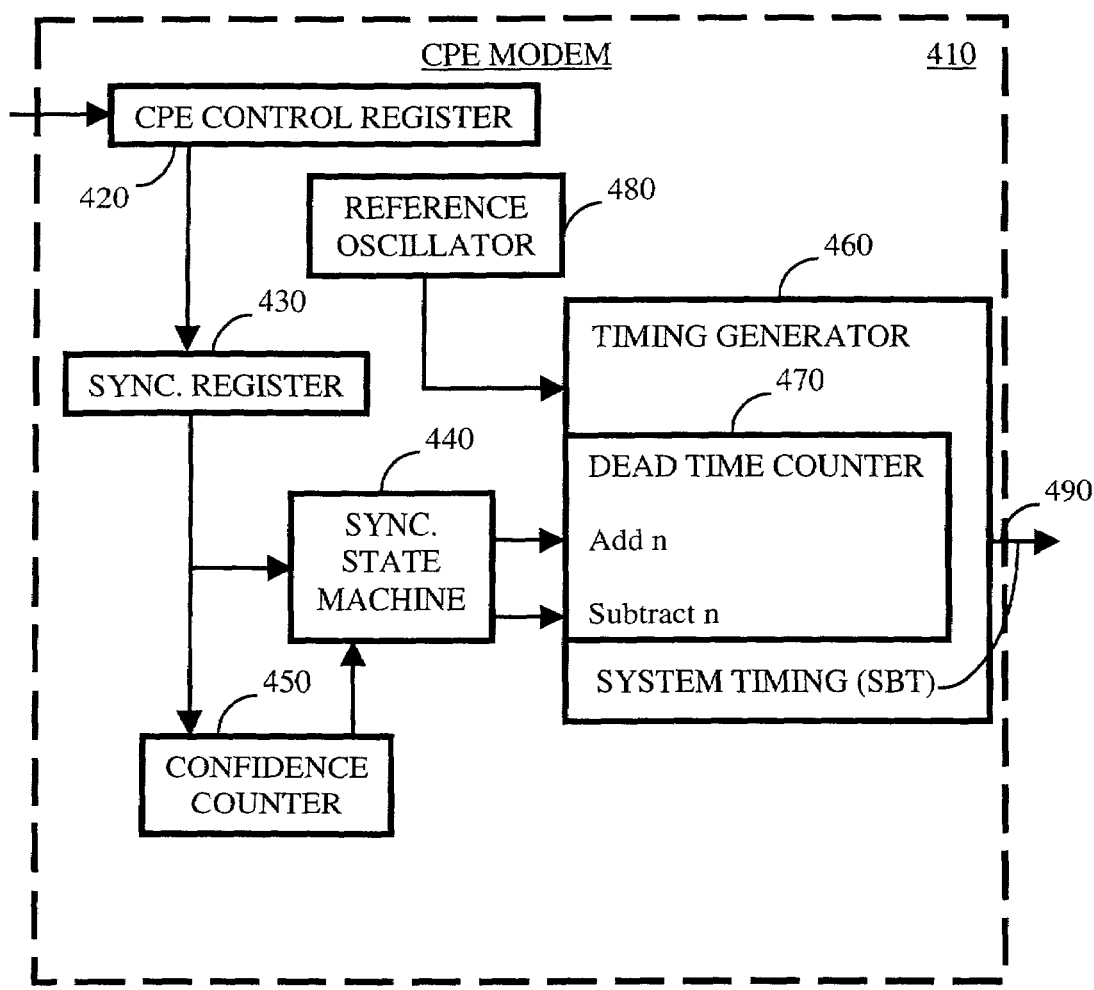
FIG. 4 is schematic block diagram of a modem subsumed by customer premises equipment, which modem is constructed according to the present invention.

FIG. 3 gives greater detail of system timing generators (260) constructed in accordance with the present invention. As was previously mentioned, synchronization (or "alignment") of the APEs 110 is carried out in the system timing generator in the preferred embodiment of the present invention, although it will be appreciated by those skilled in the art, that it is possible to implement the synchronization functions of the present invention elsewhere, given the description in this Letters Patent.

While the system timing generator 260 in FIG. 3 belongs to a master APE, system timing generators in slave APEs are similarly constructed in the preferred embodiment. A symbol clock signal output via line 344 from a timing generator 340 is divided by a divider 330 to approximate 1 hertz pulses. The output of the divider 330 is presented to a first input of an error detector 320, while a second input 310 of the error detector 320 receives the aforementioned GPS timing signal (1 pulse per second, or 1 hertz). The error detector 320 determines whether there is a phase difference between the GPS timing signal and the divided version of the System Timing (SBT) signal generated by the system burst timer 340. The phase error, vel non, between the output of the divider 330 and the GPS timing signal causes a synchronization state machine 370 to either output an "add n time units" signal when the SBT signal is too fast, a "subtract n time units" signal when the SBT signal is too slow, or no signal when there is no appreciable phase error, and the SBT signal and the GPS timing signal are synchronized within a predefined tolerance. The time units added or subtracted can be chips, symbols, or any multiple or fraction thereof, but must be synchronous with the chip timing.

The output ("synchronization information") of the synchronization state machine 370 is fed to the inputs of a dead time counter 350 in the timing generator, responsible for adjusting both the system timing (SBT) signal via output 396 and the symbol clock signal. The system timing signal (SBT) synchronizes the operation of components in the particular APE 110. The synchronization information is also stored in a synchronization register 380 and a CPE control register 390. The synchronization information includes both add/subtract n time unit signals, as appropriate, and a timing marker indicating when the timing is to be changed.

The timing information from the synchronization register 380 is output (via output 382) to the slave APEs and to the APE receivers. The APE receivers (not shown) have similar timing generator with a dead time counter, and makes the indicated timing change as required. The synchronization state machine in the slave APEs receive the synchronization information from the synchronization register in the master APE to adjust their System Timing signals to the master.

The synchronization of the CPEs with the APEs in the present-inventive TDD system is carried out by each CPE's modem. As an example, the CPE modem 410 (which is subsumed by a CPE 120) shown in FIG. 4, periodically receives APE synchronization information from its associated APE. The synchronization information, which is first stored in a CPE control register 420, is in the form of an "add n" or "subtract n" time units, along with the aforementioned time marker. To insure the integrity of the system, the synchronization information is repeated for several bursts. The synchronization information is then stored in a synchronization register 430. Meanwhile, a confidence counter 450 serves as an error detector to examine the synchronization information bursts, and to detect whether the synchronization information contains transmission errors.

If the confidence counter 450 does not detect transmission errors above a set threshold, it enables a synchronization state machine 440 to output either an "add n" time units, a "subtract n" time units, or no change at all in response to the synchronization information. A timing generator 460, responsible for outputting a System Timing (SBT) signal to the rest of the CPE via output line 490 uses a reference oscillator 480 to derive its output. The timing generator 460 contains a dead time generator 470 which is used to either speed up, slow down, or maintain the System Timing signal (SBT), as was previously described with respect to the APEs.

The Timing Generator 460 adjusts as is needed, the System Timing (SBT) in the following manner. The Dead Time Counter is instructed by the Synchronization state machine 440 to add n time units when the APE local oscillator is running faster than the GPS timing signal, and subtract n time units when the APE local oscillator is running slower than the GPS timing signal.

Thus has been disclosed, a novel method and system for synchronizing Access Points and CPEs in a time division duplex system without expensive voltage controlled oscillators in the Access Points.

Variations and modifications of the present invention are possible, given the above description. However, all variations and modifications which are obvious to those skilled in the art to which the present invention pertains are considered to be within the scope of the protection granted by this Letters Patent.

What is claimed is:

1. In a Time Division Duplex (TDD) system, an apparatus for temporally aligning Access Points (APEs) and Customer Premises Equipment (CPE) in the system, said apparatus comprising:
    a Global Positioning System (GPS) receiver for receiving GPS timing signals;
    an APE local oscillator for floting within tolerances without being precisely locked onto the GPS signal;
    a timing generator having a dead time counter, said timing generator coupled to said local oscillator and for generating a system burst timing signal;
    a phase error detector for comparing said GPS timing signals with a symbol clock signal derived from said system burst timing signal; and
    a synchronization state machine coupled to said phase error detector for generating synchronization information in response to the output of said phase error detector, said synchronization information, including add/subtract n time unit signals, and applied to said dead time counter to just the system burst timing signal of said time generator.

2. The apparatus in claim 1, wherein said synchronization information comprises a symbol time correction signal adapted to be utilized by said dead time counter to add or subtract time units to or from said local oscillator frequency, and a time marker indicating when changes to said local oscillator frequency are to occur.

3. The apparatus in claim 1, wherein said apparatus subsumes a master APE, and said apparatus further comprises a synchronization output adapted to output said synchronization information to at least one slave APE in said TDD system, and to a master clock reference, wherein said at least one slave APE is adapted to adjust slave local oscillators in accordance with said synchronization information, and said master clock reference is adapted to adjust its local oscillator in accordance with said synchronization information.

4. The apparatus in claim 3, wherein said at least one slave APE is constructed with a receiver, said slave APE receiver constructed having a timing circuit comprised of a slave APE receiver synchronization circuit, said slave APE receiver synchronization circuit comprising:
 a slave APE receiver synchronization information register adapted to store synchronization information received from said master APE;
 a slave APE receiver timing generator having a dead time counter, said slave APE timing generator coupled to said slave APE receiver synchronization information register and adapted to generate a system burst timing signal; and
 a slave APE receiver synchronization state machine coupled to said synchronization information register adapted to, in response to said synchronization information, adjust the burst timing of said APE receiver via said dead time counter, to synchronize the APE receiver to the master APE burst timing.

5. The apparatus in claim 1, wherein said apparatus subsumes a slave APE, and said apparatus further comprises a synchronization information register for receiving synchronization information from a master APE, and said synchronization state machine is responsive to said synchronization information from said master APE.

6. The apparatus in claim 1 further comprising in each Customer Premises Equipment (CPE) serviced by said TDD system, a CPE synchronization circuit, said CPE synchronization circuit comprising:
 a CPE synchronization information register adapted to store synchronization information received from an APE;
 a CPE local oscillator;
 a CPE timing generator having a dead time counter, said timing generator coupled to said CPE local oscillator and adapted to generate a system burst timing signal; and
 a CPE synchronization state machine coupled to said synchronization information register adapted to, in response to said synchronization information, adjust the burst time of said CPE via said dead time counter, to synchronize the CPE local burst timing with the APE master burst timing.

7. The apparatus in claim 6, wherein said CPE synchronization circuit further comprises:
 a confidence counter coupled to said CPE synchronization state machine and to said CPE synchronization information register, adapted to activate said CPE synchronization state machine when synchronization information is determined by said confidence counter to be accurate.

8. In a Time Division Duplex (TDD) system, a method for temporally aligning Access Points (APES) in the system, said method comprising the steps of:
 receiving Global Positioning System (GPS) timing signals;
 via an APE local oscillator for floting within tolerances without being precisely locked onto the GPS signal, generating an APE reference clock signal;
 via a timing generator having a dead time counter, generating a system burst timing signal;
 detecting a phase error between said GPS timing signals and a symbol clock signal derived from said system burst timing signal; and
 via a synchronization state machine coupled to said phase error detector, generating synchronization information in response to the output of said phase error detector, said synchronization information, including add/subtract n time unit signals; and
 applying said synchronization information to said dead time counter to adjust said the system burst timing signal of said timing generator.

9. The method in claim 8, wherein said synchronization information comprises a symbol time correction signal adapted to be utilized by said dead time counter to add or subtract time units to or from said system burst timing, and a time marker indicating when changes to said system burst timing are to occur.

10. The method in claim 8, wherein the steps are carried out by a master APE, and said method further comprises the step of outputting said synchronization information to slave APEs in said TDD system, wherein said slave APEs are adapted to adjust slave burst timing in accordance with said synchronization information.

11. The method in claim 8, wherein a slave APE carries out said method, and said method further comprises the steps of:
 via a synchronization information register, receiving synchronization information from a master APE; and
 controlling the operation of said synchronization state machine by said synchronization information from said master APE.

12. The method in claim 8 further wherein each Customer Premises Equipment (CPE) serviced by said TDD system adjusts its timing according to at least the following steps:
 via a CPE synchronization information register, storing synchronization information received from an APE;
 via a CPE recovered timing, generating a CPE reference signal;
 via a CPE timing generator coupled to said CPE recovered timing and having a dead time counter, generating a system burst timing signal; and
 via a CPE synchronization state machine coupled to said synchronization information register, and in response to said synchronization information, adjusting the CPE burst timing via said dead time counter, to synchronize the CPE burst timing with the APE system burst timing.

13. The method in claim 12, further comprising the step of:
 via a confidence counter coupled to said CPE synchronization state machine and to said CPE synchronization information register, activating said CPE synchronization state machine when synchronization information is determined to be accurate.

* * * * *